United States Patent [19]

Dick

[11] Patent Number: 4,845,441

[45] Date of Patent: Jul. 4, 1989

[54] AMPLIFIER CIRCUIT WITH BIPOLAR TRANSISTORS

[75] Inventor: Burkhard Dick, Hamburg, Fed. Rep. of Germany

[73] Assignee: U.S. Philips Corporation, New York, N.Y.

[21] Appl. No.: 195,743

[22] Filed: May 18, 1988

[30] Foreign Application Priority Data

May 20, 1987 [DE] Fed. Rep. of Germany ....... 3716874

[51] Int. Cl.[4] ............................................. H03F 3/191
[52] U.S. Cl. .................................... 330/302; 330/149; 330/306
[58] Field of Search ............... 330/149, 293, 294, 302, 330/303, 304, 305, 306

[56] References Cited

U.S. PATENT DOCUMENTS

| 4,186,360 | 1/1980 | Ohashi | 334/15 X |
| 4,559,503 | 12/1985 | Camand et al. | 330/302 |
| 4,779,056 | 10/1988 | Moore et al. | 330/302 X |

FOREIGN PATENT DOCUMENTS

| 2229279 | 1/1973 | Fed. Rep. of Germany . |
| 2202896 | 7/1973 | Fed. Rep. of Germany . |
| 15507 | 1/1982 | Japan . |
| 207412 | 12/1982 | Japan . |

OTHER PUBLICATIONS

Y. Netzer, "The Design of Low Noise Amplifiers", IEEE proc., vol. 69, No. 6, Jun. 1981, pp. 728–741.
K. B. Niclas, "Noise in Broad Band GaAs MESFET Amplifiers with Parallel Feedback", IEEE Trans. Microwave T & T, vol. 30, No. 1, Jan. 1982, pp. 63–70.
E. H. Nordholdt et al., "The Design of Extremely Low Noise Camera Tube Preamps", IEEE Trans. Inst. & Meas., vol. 32, No. 2, Jun. 1983, pp. 331–336.

*Primary Examiner*—Steven Mottola
*Attorney, Agent, or Firm*—Marianne R. Rich

[57] ABSTRACT

The invention relates to a circuit comprising an amplifier with bipolar transistors, which amplifier is fed by a signal source with a complex internal resistance and which has a signal negative feedback path connecting the amplifier output to the signal source. For reducing the noise, especially the input noise current which is particularly predominant in circuits of this kind which have a sufficiently large source impedance, a reactance network is arranged between the amplifier and the signal source. The network, in connection with the signal source and the negative feedback path, constitutes a filter which is parallel to the amplifier input and which has at least a series resonance frequency within the signal frequency range.

14 Claims, 2 Drawing Sheets

AMPLIFIER CIRCUIT WITH BIPOLAR TRANSISTORS

The invention relates to a circuit comprising an amplifier with bipolar transistors. The amplifier is fed by a signal source with a complex internal resistance and which has a signal negative feedback path connecting the amplifier output to the signal source. Circuits of this type are essentially known.

SUMMARY OF THE INVENTION

It is an object of the present invention to realize such a circuit in such a way that the noise is essentially reduced in the case of where a broadband signal source having a complex source impedance is connected to the amplifier. According to the invention this object is realized in that a reactance network is arranged between the amplifier and the signal source, which network, in connection with the signal source and the negative feedback path, constitutes a filter which is parallel to the amplifier input and which has at least a series resonance frequency within the signal frequency range.

In a transistor amplifier the noise of the input transistor generally has the greatest influence on the overall noise of the amplifier. Current noise is generally predominant in bipolar transistors. The influence of this current noise on the output signal is reduced by the series resonance. The circuit arrangement according to the invention can therefore be used advantageously as a broadband input stage with low noise for sources having an inductive or a capacitive generator impedance.

The invention will now be described in greater detail by way of example with reference to the accompanying drawings.

DESCRIPTION OF THE PREFERRED EMBODIMENT

Figure 1:
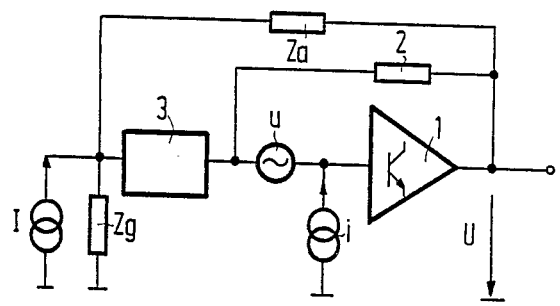
FIG. 1 is the basic circuit diagram of a circuit according to the invention.

FIG. 1 shows a diagram of a noisy amplifier consisting of a noise-free amplifier 1 of a noise voltage source u operating in series with the (inverting) input of the amplifer and a noise current source i connected to this input. The voltage and currents supplied by the noise sources u and i, respectively, are generally statistically independent, uncorrelated quantities. The amplifier 1, whose structure is not further shown, comprises bipolar transistors in which the influence of current noise is predominant if the source impedance is sufficiently large.

The amplifier output from which the output voltage U can be derived is connected to the amplifier input through a DC negative feedback path. The DC negative feedback path comprises an impedance 2, generally a high-ohmic resistor, whilst the noise components thereby produced are assumed to be contained in the noise current source i.

A further negative feedback branch is provided which connects the output through an impedance Za to a signal generator having a complex generator resistance. The generator is shown in FIG. 1 by means of a signal current source supplying a signal current I and a complex resistor Zg connected parallel thereto. The ohmic component of this generator resistance should be possibly small in the signal frequency range as compared with its capacitive or inductive reactive component in order that the influence of the noise produced thereby remains small.

The junction point of the signal source I, Zg and the negative feedback impedance Za is connected to the input of the amplifier 1 by a reactance network 3. If this reactance network were absent, the amplifier would have the same transmission behaviour for the signal current I and the noise current i. The reactance network 3 decouples the useful signal source from the noise signal source in such a way that the noise at the output is reduced without essentially influencing the signal transmission—and without affecting the stability—in the signal transmission range. For this purpose the reactance network 3 in connection with the negative feedback impedance Za is dimensioned in the case of a given source impedance in such a way that a series resonance results in the signal frequency range which reduces its influence on the amplifier output signal. Since the signal transmission remains essentially uninfluenced by the negative feedback through the impedance Za, an improvement of the signal-to-noise ratio is obtained.

This principle will hereinafter be explained in greater detail with reference to two concrete embodiments shown in FIGS. 2 and 5 in which similar components have the same reference symbols.

Figure 2:
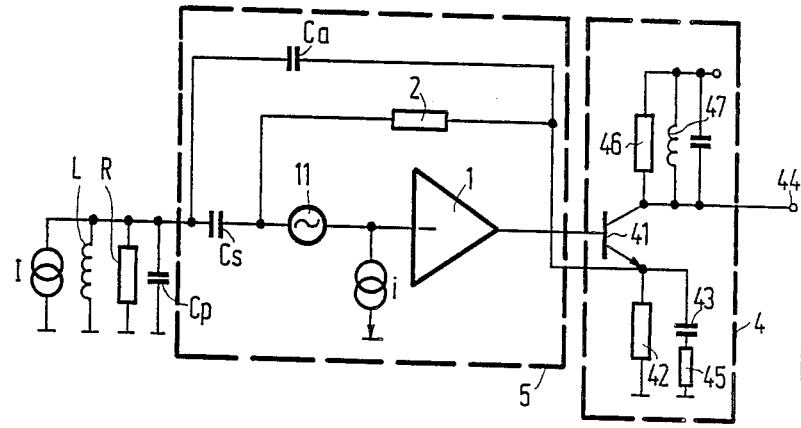
FIG. 2 shows a first embodiment.

FIG. 2 shows a broadband input stage of a medium wave receiver with an inductive generator impedance in the form of a medium wave aerial. The generator impedance is shown in FIG. 2 as a substitution circuit comprising an inductance L of 0.5 mH and a resistor R of approximately 500 kOhm arranged parallel thereto. The impedance Za is constituted by a capacitor Ca of 5 pF, whilst the reactance network 3 is constituted by a capacitor Cp arranged parallel to L and R and a capacitor Cs of 60 pF which is arranged between the generator and the amplifier input. The amplifier has an input resistance of 22 kOhm and an amplification of 38 dB at 1 MHz which decreases by 20 dB/decade in the medium wave range.

For the noise current source i the arrangement according to FIG. 2 operates as a filter which has a transmission minimum (series resonance) at the resonance frequency of the inductance L with the sum of Ca, Cs and Cp, whilst the frequency for this minimum is lower as the capacitance of capacitor Cp is larger.

A minimum also results for the voltage noise, however at the resonance of the inductance L with the sum of Cp and Ca (i.e. this minimum is independent of the capacitance of capacitor Cs). Accordingly, the minimum for the voltage noise is higher than the minimum for the current noise (at the same capacitance Cp).

Due to the frequency dependence of the transmission of the voltage and current noise an overall noise whose minimum is between the minima for the current and voltage noise results at the output. This minimum can be brought to a desired frequency position in the transmission band by suitable choice of the capacitance of capacitor Cp.

In contrast thereto, the signal transmission for the generator current I is substantially not influenced by the capacitance Cp due to the negative feedback via the capacitor Ca, and it is even not influenced if this capacitance is chosen to be such that together with the inductance L it constitutes a resonance in the transmission range. In this case the loop gain increases to such an extent that no resonance step-up can occur at the output of the amplifier. In the case of a constant generator current I the output voltage in the medium wave range, i.e. from 535 to 1605 kHz, decreases approximately linearly by approximately 10 dB. This decrease is caused by the negative feedback through the capacitor Ca increasing with an increasing frequency.

Figure 4A:
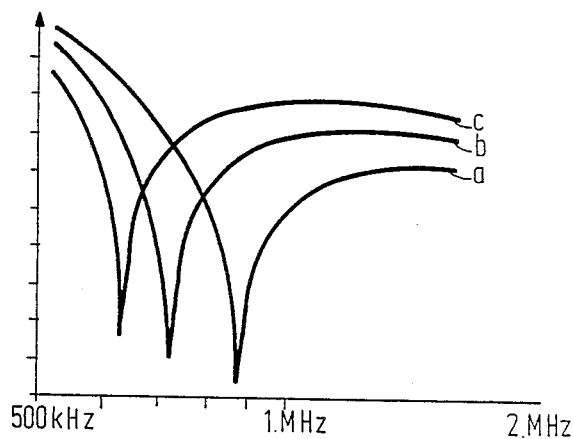
FIGS. 4a, 4b and 4c show the waveforms of different, noiseessential parameters as a function of the frequency in a circuit according to FIG. 2.

In FIG. 4a the transmission factor for the noise current i (i.e. the voltage produced by the noise current at the output of the amplifier 1, divided by the noise current i) is shown on a logarithmic scale as a function of the frequency (likewise on a logarithmic scale), and this for different capacitances of Cp. The curve a results for Cp=2 pF, b results for Cp=30 pF and curve c results for Cp=60 pF. The minimum of the current noise is thus shifted to low frequencies with an increasing capacitance.

Figure 4B:
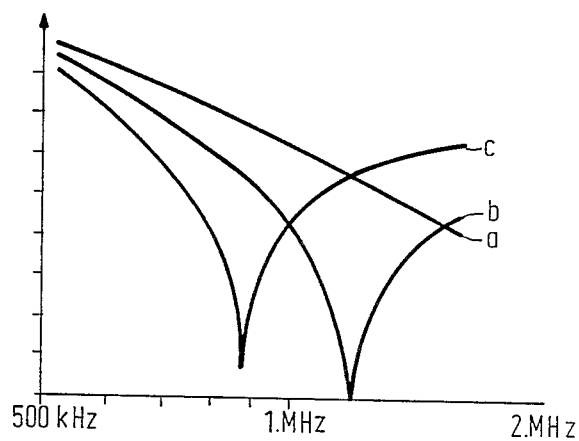

Analogously, FIG. 4b shows the transmission factor for the voltage noise $\mu$ as a function of the frequency for the same capacitances. As already stated, the minimum value of the voltage noise is higher than the minimum value of the current noise, the minimum for Cp=2 pF (curve a) being outside the transmission range.

Figure 4C:
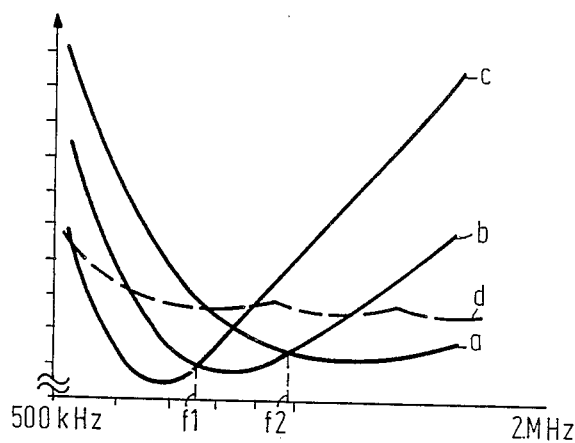

FIG. 4c shows the overall noise, i.e. the equivalent input noise current parallel to the signal current which would produce the same noise at the output of an identical, but noise-free arrangement as the noise occurring in the present circuit arrangement, as a function of the frequency and also with Cp as a parameter. Relatively broad noise minima can be recognized which, however, only cover a part of the medium wave range.

As already stated, the amplification of the useful signal is also dependent on the frequency in the circuit arrangement of FIG. 2. To eliminate this frequency dependence, the circuit arrangement according to the invention is succeeded by a compensation stage 4 having an inverse frequency characteristic so that the output signal of this stage is essentially frequency-independent—in the case of a constant aerial signal.

This stage may comprise, for example, a bipolar transistor 41 whose emitter resistor 42 is shunted by the series arrangement of a capacitor 43 of 150 pF and a resistor 45 of 500 Ohm for the medium wave range frequencies. A capacitive emitter impedance with an ohmic component results therefrom. The base of the transistor 41 is connected to the output of the amplifier 1 and the emitter of the transistor 41 is connected to the capacitor Ca and the DC resistor 2. The resistor 2 may, however, alternatively be connected directly to the output of amplifier 1. The collector is connected to a supply voltage through a resistor 46 with which a parallel resonant circuit 47 tuned to approximately 2 MHz is arranged in parallel. The collector impedance thereby becomes inductive with an ohmic component. In this circuit arrangement a substantially frequency-independent output signal results at the collector which constitutes the output 44 of the circuit arrangement.

Figure 3:
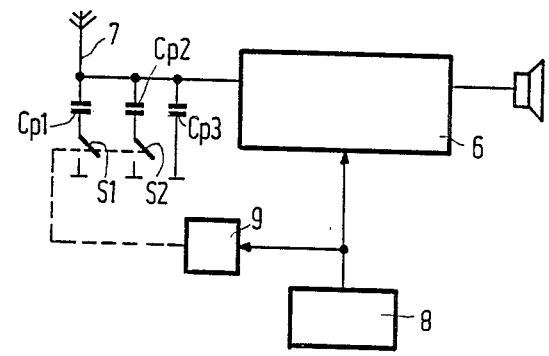
FIG. 3 shows the use of a circuit arrangement according to FIG. 2 in a medium wave receiver.

FIG. 3 shows a medium wave receiver constructed in accordance with the principle shown in FIG. 2. The receiver section 6 comprises the compensation circuit 4, the part 5 of the circuit according to the invention shown in broken lines in FIG. 2 and further signal processing components. The series arrangement of a first capacitor Cp1 and a first switch S1 as well as the series arrangement of a second capacitor Cp2 and a second switch S2 are arranged parallel to the aerial input 7. The capacitor Cp3 arranged parallel to the aerial input represents the winding capacitance of the aerial. If Cp1 and Cp2 are each approximately 30 pF, either 2 pF, 32 pF or 62 pF are active at the aerial input, dependent on the position of the switches S1 and S2.

The switches S1 and S2 are operated by a logic circuit 9 which is controlled by the running unit 8 of the receiver 6, which unit also fixes the tuning frequency of the receiver 6. The logic circuit 9 derives the switching signals for the switches S1 and S2 from the tuning data of the tuning unit 8, for example, the frequency division factors for a PLL circuit in the receiver section 6. The circuit 9 is constructed in such a way that the two switches are closed at low medium wave frequencies up to approximately the frequency f1 (compare FIG. 4c) so that the noise up to this frequency varies in accorance with curve c. Between the reception frequencies f1 and f2 one of the two switches S1, S2 is open and the other disclosed. A capacitance of approximately 32 pF then results at the input with a noise variation in accordance with curve b, which in this frequency range is lower than the noise according to curve c or a.

Above the frequency f2 at which the curves a and b intersect each other, the two switches S1 and S2 are opened so that only the capacitance Cp3 of 2 pF is active at the aerial input. The noise then varies in accordance with curve a in FIG. 4c. Due to this changeover it is achieved that the capacitance combination producing the lowest noise is always active at the input.

For the purpose of comparison FIG. 5c shows the broken line curve d for the overall noise which would result if the capacitor Cs were absent and if the switches S1 and S2 were switched in dependence upon the tuning frequency such that a noise minimum would result. The improvement realized by the invention can clearly be recognized.

As already stated, the parallel resonance determined by the capacitor Cp in connection with the inductive impedance L of the generator cannot lead to resonance step-ups due to the negative feedback through Ca. Consequently, the currents through the switches S1 and S2 always remain relatively low in the circuit arrangement according to FIG. 3 so that their finite resistance (particularly if they are formed as semiconductor switches) leads to signal losses which are only inconsequential. Moreover, the change-over ensures that the parallel resonant circuit consisting of the inductance L and the capacitance Cp parallel thereto is always operated below its resonance frequency so that resonance effects are therefore also avoided.

The reduction of the noise realized by means of the invention in the medium wave receiver is not as large as it would be in a receiver in which the aerial input would always be tuned to the reception frequency. Such a receiver would, however, either require a relatively expensive variable capacitor or a capacitance diode which requires relatively large tuning voltages. Moreover, an exact alignment between the oscillator and input circuits would be required in such a receiver. In contrast thereto, the invention can also be utilized—particularly as an integrated circuit—in receivers having a low supply voltage (for example 3 V). An alignment is not required.

Although the circuit according to FIG. 2 has been explained in connection with a medium wave receiver, it may also be used in other cases as a broadband input stage if only the signal generator has an essentially inductive generator resistance as in, for example, the reproducing head of a magnetic tape apparatus. In this case the dimensioning of the reactance network Cs, Cp (and of the negative feedback capacitor Ca) should be adapted to the requirements imposed by such a circuit arrangement.

Figure 5:
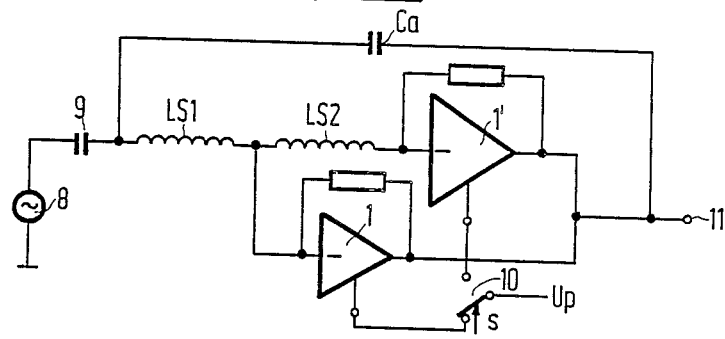
FIG. 5 shows another embodiment according to the invention.

FIG. 5 exemplifies the invention with reference to a broadband input stage for capacitive signal generators such as, for example, a capacitive aerial. In this case the signal source is shown by way of a substitution diagram comprising the series arrangement of a signal voltage generator 8 and a capacitor 9. The reactance network is connected by a first inductance LS1 to the input of a first amplifier 1 (whose input noise sources are not separately shown). The output of this amplifier is connected by a capacitor Ca to the junction point of the generator 8, 9 and the first inductance LS1. The inductance LS1 is dimensioned in such a way that a series resonance results in the signal transmission range which reduces the noise caused by the noise current source (not shown) at the output 11 of the circuit.

A parallel resonance does not result in the circuit according to FIG. 5 so that the voltage noise is substantially not influenced. Since the current noise in an amplifier with bipolar transistors is predominant in the case of a sufficiently large generator impedance, this is not a consequential drawback. For this reason the circuit is frequency independent due to the capacitive negative feedback in connection with the capacitive generator.

Similarly as in the circuit of FIG. 1 the noise is only influenced in a given frequency range around the resonance point. In order to suppress the noise in a broader frequency range in a receiver circuit, the reactance network in the circuit according to FIG. 5 should be rearranged in a similar way as in FIG. 3. For this purpose a second inductance LS2 is connected to the input of the first amplifier 1 and its other terminal is connected to the inverting input of a further amplifier 1' which has the same properties as the amplifier 1. The output of this amplifier is connected to the output of the amplifier 1. The power supply terminals of the amplifiers 1, 1' are connected through a change-over switch to a power supply source so that only one of the two amplifiers is operative.

When tuning to a lower frequency range, the change-over switch 10 is connected to the power supply terminal of the amplifier 1', while the reactance network is given by the series circuit of the two inductances LS1 and LS2. This reduces the noise in the lower frequency range. When tuning to a higher frequency range, the changeover switch 10 is switched by a control signal s (which can be generated analogously as the switching signals for the switches S1, S2 in the circuit according to FIG. 3) in the switching position shown in FIG. 5. In this case only the inductance LS1 is active.

Also in this case the signal transmission is substantially not influenced by the inductances LS1 and LS2 due to the negative feedback from the output 11 through Ca to the signal source.

The embodiment of FIG. 5 is not limited to receiver circuits having a capacitive aerial. It can be used in all those cases in which a generator having an essentially capacitive generator resistance is provided, for example, a capacitor microphone.

I claim:

1. A circuit for amplifying a signal from a signal source (I) having a complex internal impedance Zg comprising:
   a bipolar transistor amplifier;
   a negative feedback path connected from an output of said bipolar amplifier to an input of a reactance network and,
   said reactance network connected between the signal source and an input of said transistor amplifier, said reactance network providing a series resonant circuit between said bipolar transistor amplifier input and said signal source, said series resoannt circuit having a resonant frequency within the bandwidth of a signal provided by said signal source such that current noise in a signal at said amplifier output is reduced.

2. The circuit of claim 1 wherein said reactance network comprises:
   an inductor and resistor connected in parallel with said signal source;
   a series capacitor serially connecting said signal source to said input terminal;
   a plurality of capacitors having one end connected to said signal source; and
   switching means connected to individual remaining ends of said capacitors for connecting one of said capacitors in parallel with said inductor and resistor, thereby changing the resonant frequency of said reactance network.

3. The circuit of claim 1 wherein said reactance network comprises a series circuit comprising first and second inductors serially connecting said signal source to said amplifier input;
   a second amplifier having an input connected to the junction of said first and second serially connected inductors, and an output connected to said first amplifier output; and,
   means for selectively powering said first and second amplifiers, whereby a frequency range may be selected for optimally reducing noise for a signal from said signal source.

4. The circuit of claim 1 further comprising a compensation circuit for correcting amplitude versus frequency changes which occur in a signal produced by said amplifier.

5. The circuit of claim 1 further including means for changing the resonant frequency of said reactance network whereby an optimum noise performance may be selected for a given input signal frequency.

6. A circuit as claimed in claim 1, in which the signal source has an inductive internal resistance, and the reactance network comprises a first capacitor (Cs) arranged between the signal source (I) and the amplifier input.

7. A circuit as claimed in claim 6, further comprising a second capacitor (Cp) in parallel with the signal source.

8. A circuit as claimed in claim 1 wherein the signal source has a capacitive resistance, and the reactance network comprises an inductance (LS1, LS2) connected between the signal source and the amplifier input.

9. A circuit arrangement as claimed in claim 1, wherein characterized in that a capacitor (Ca) is connected in the negative feedback path.

10. A circuit arrangement as claimed in claim 7 further comprising a first switch which can be activated in dependence upon a tuning frequency connected in series with the second capacitor.

11. A circuit as claimed in claim 10, wherein a further capacitor is in series with a serial switch which is in parallel with the second capacitor and first switch.

12. A circuit as claimed in claim 8 wherein characterized the inductance comprises a plurality of series connected coils (LS1, LS2), in which the junction points of the coils and their terminals remote from the signal source are connected to the respective input of an amplifier (1, 1'), the power supply voltage of each one of the amplifiers being disconnectable in dependence upon the tuning frequency.

13. A circuit as claimed in claim 9, further comprising a compensation stage (4) which has a frequency characteristic which is inverse to that of the circuit comprising said amplifier, reactance network and negative feedback network.

14. A circuit as claimed in claim 13, wherein the compensation stage comprises a transistor (41) with a capacitive emitter impedance (41, 43, 45) and an inductive collector impedance (46, 47), and the base of the transistor is connected to the output of the amplifier and the negative feedback capacitor (Ca) is connected to the emitter and the collecter of the transistor (41) constitutes the output (44) of the compensation stage.

* * * * *